(12) United States Patent
Takahashi et al.

(10) Patent No.: US 11,477,589 B2
(45) Date of Patent: Oct. 18, 2022

(54) AUDIO SIGNAL REPRODUCTION APPARATUS AND CONTROL METHOD

(71) Applicant: SONY CORPORATION, Tokyo (JP)

(72) Inventors: Yousuke Takahashi, Kanagawa (JP); Hidehiko Chaki, Saitama (JP); Tomoki Kurasawa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 254 days.

(21) Appl. No.: 16/348,969

(22) PCT Filed: Dec. 11, 2017

(86) PCT No.: PCT/JP2017/044382
§ 371 (c)(1),
(2) Date: May 10, 2019

(87) PCT Pub. No.: WO2018/135182
PCT Pub. Date: Jul. 26, 2018

(65) Prior Publication Data
US 2019/0273997 A1 Sep. 5, 2019

(30) Foreign Application Priority Data

Jan. 20, 2017 (JP) .............................. JP2017-008399

(51) Int. Cl.
*H04R 29/00* (2006.01)
*H01M 10/48* (2006.01)
(Continued)

(52) U.S. Cl.
CPC .......... *H04R 29/001* (2013.01); *H01M 10/42* (2013.01); *H01M 10/48* (2013.01);
(Continued)

(58) Field of Classification Search
CPC ....... H04R 29/001; H04R 3/00; H01M 10/42; H01M 10/48; H01M 10/486; H02J 7/00; H03F 3/181; H03F 2200/03
(Continued)

(56) References Cited

U.S. PATENT DOCUMENTS 7,208,916 B1 * 4/2007 Boatwright ......... H01M 10/486
320/150
2007/0140513 A1 * 6/2007 Furge ...................... H03F 1/32
381/120

(Continued)

FOREIGN PATENT DOCUMENTS

CN 101396975 A 4/2009
CN 102379089 A 3/2012
(Continued)

OTHER PUBLICATIONS

International Search Report and Written Opinion of PCT Application No. PCT/JP2017/044382, dated Mar. 6, 2018, 08 pages of ISRWO.

(Continued)

*Primary Examiner* — Vivian C Chin
*Assistant Examiner* — Con P Tran
(74) *Attorney, Agent, or Firm* — Chip Law Group

(57) ABSTRACT

An audio signal reproduction apparatus includes a temperature detection unit detecting a temperature of a battery pack, a voltage detection unit detecting a voltage of the battery pack, and a control unit performing an output control on a basis of temperature information detected by the temperature detection unit and voltage information detected by the voltage detection unit.

11 Claims, 11 Drawing Sheets

(51) Int. Cl.
*H04R 3/00* (2006.01)
*H03F 3/181* (2006.01)
*H02J 7/00* (2006.01)
*H01M 10/42* (2006.01)

(52) U.S. Cl.
CPC ............ *H01M 10/486* (2013.01); *H02J 7/00* (2013.01); *H03F 3/181* (2013.01); *H04R 3/00* (2013.01); *H03F 2200/03* (2013.01)

(58) Field of Classification Search
USPC ................ 381/58, 56, 59, 150, 120, 28, 55; 361/18, 62, 79; 338/22 R
See application file for complete search history.

(56) References Cited

U.S. PATENT DOCUMENTS

| | | | |
|---|---|---|---|
| 2010/0244951 A1 | 9/2010 | Smith | |
| 2011/0025414 A1 | 2/2011 | Wolf et al. | |
| 2013/0127611 A1* | 5/2013 | Bernstein | B60L 58/14 340/455 |
| 2015/0263684 A1 | 9/2015 | Tu | |

FOREIGN PATENT DOCUMENTS

| | | |
|---|---|---|
| CN | 103283284 A | 9/2013 |
| CN | 104348222 A | 2/2015 |
| CN | 106054079 A | 10/2016 |
| DE | 102010038482 A1 | 2/2011 |
| EP | 1935209 A1 | 6/2008 |
| EP | 2415177 A1 | 2/2012 |
| EP | 3112981 A1 | 1/2017 |
| JP | 2005-020383 A | 1/2005 |
| JP | 2009-219221 A | 9/2009 |
| JP | 2010-252505 A | 11/2010 |
| JP | 2014-063288 A | 4/2014 |
| JP | 2015-122742 A | 7/2015 |
| JP | 2016-054438 A | 4/2016 |
| JP | 2016-054438 A1 | 4/2016 |
| KR | 10-2011-0132625 A | 12/2011 |
| WO | 2007/042026 A1 | 4/2007 |
| WO | 2010/114939 A1 | 10/2010 |
| WO | 2010/150087 A1 | 12/2010 |

OTHER PUBLICATIONS

Office Action for CN Patent Application No. 201780083225.X, dated Sep. 30, 2020, 11 pages of Office Action and 19 pages of English Translation.

Office Action issued in CN Appln. No. 201780083225.X dated May 17, 2021 (10 pp OA, 18 pp. translation).

Shi Faqiang, The research of voltage's accuracy and temperature effect on the MH-Ni battery group, Chongqing Research Institute of CCTEG, translation of abstract only, pp. 3, translation of abstract only dated Oct. 25, 2013.

Office Action for CN patent application No. 201780083225 dated Oct. 26, 2021, pp. 7.

* cited by examiner

[Example of battery temperature 20°C and voltage 6.0V]

FIG.9A

| State | Battery temperature [°C] | Limit [dB] |
|---|---|---|
| 1 | t≦42 | 0 |
| 2 | 42<t≦44 | -0.5 |
| 3 | 44<t≦46 | -1.0 |
| 4 | 46<t≦48 | -1.5 |
| 5 | 48<t≦50 | -2.0 |
| 6 | 50<t≦52 | -2.5 |
| 7 | 52<t≦54 | -3.5 |
| 8 | 54<t≦56 | -4.5 |
| 9 | 56<t | -6.0 |

TA1

[Table corresponding to battery temperature 20°C]

FIG.9B

| State | Battery voltage [V] | Limit [dB] |
|---|---|---|
| 1 | 7.2≦Vbat | 0 |
| 2 | 6.8≦Vbat<7.2 | -0.5 |
| 3 | 6.6≦Vbat<6.8 | -1.0 |
| 4 | 6.4≦Vbat<6.6 | -2.0 |
| 5 | 6.2≦Vbat<6.4 | -3.0 |
| 6 | 6.0≦Vbat<6.2 | -4.0 |
| 7 | 5.8≦Vbat<6.0 | -6.0 |
| 8 | 5.6≦Vbat<5.8 | -8.0 |
| 9 | Vbat<5.6 | -12.0 |

TA2

[Example of battery temperature 0°C and voltage 6.0V]

FIG.10A

| State | Battery temperature [°C] | Limit [dB] |
|---|---|---|
| 1 | t≦42 | 0 |
| 2 | 42<t≦44 | -0.5 |
| 3 | 44<t≦46 | -1.0 |
| 4 | 46<t≦48 | -1.5 |
| 5 | 48<t≦50 | -2.0 |
| 6 | 50<t≦52 | -2.5 |
| 7 | 52<t≦54 | -3.5 |
| 8 | 54<t≦56 | -4.5 |
| 9 | 56<t | -6.0 |

~TA1

[Table corresponding to battery temperature 0°C]

FIG.10B

| State | Battery voltage [V] | Limit [dB] |
|---|---|---|
| 1 | 7.2≦Vbat | 0 |
| 2 | 6.8≦Vbat<7.2 | -1.0 |
| 3 | 6.6≦Vbat<6.8 | -2.0 |
| 4 | 6.4≦Vbat<6.6 | -3.0 |
| 5 | 6.2≦Vbat<6.4 | -4.0 |
| 6 | 6.0≦Vbat<6.2 | -6.0 |
| 7 | 5.8≦Vbat<6.0 | -8.0 |
| 8 | 5.6≦Vbat<5.8 | -10.0 |
| 9 | Vbat<5.6 | -16.0 |

~TA2a

[Example of battery temperature 55°C and voltage 6.0V]

FIG.11A

| State | Battery temperature [°C] | Limit [dB] |
|---|---|---|
| 1 | $t \leq 42$ | 0 |
| 2 | $42 < t \leq 44$ | −0.5 |
| 3 | $44 < t \leq 46$ | −1.0 |
| 4 | $46 < t \leq 48$ | −1.5 |
| 5 | $48 < t \leq 50$ | −2.0 |
| 6 | $50 < t \leq 52$ | −2.5 |
| 7 | $52 < t \leq 54$ | −3.5 |
| 8 | $54 < t \leq 56$ | −4.5 |
| 9 | $56 < t$ | −6.0 |

TA1

[Table corresponding to battery temperature 55°C]

FIG.11B

| State | Battery voltage [V] | Limit [dB] |
|---|---|---|
| 1 | $7.2 \leq V_{bat}$ | 0 |
| 2 | $6.8 \leq V_{bat} < 7.2$ | 0 |
| 3 | $6.6 \leq V_{bat} < 6.8$ | −0.5 |
| 4 | $6.4 \leq V_{bat} < 6.6$ | −1.0 |
| 5 | $6.2 \leq V_{bat} < 6.4$ | −2.0 |
| 6 | $6.0 \leq V_{bat} < 6.2$ | −3.0 |
| 7 | $5.8 \leq V_{bat} < 6.0$ | −5.0 |
| 8 | $5.6 \leq V_{bat} < 5.8$ | −7.0 |
| 9 | $V_{bat} < 5.6$ | −10.0 |

TA2b

AUDIO SIGNAL REPRODUCTION APPARATUS AND CONTROL METHOD

CROSS REFERENCE TO RELATED APPLICATIONS

This application is a U.S. National Phase of International Patent Application No. PCT/JP2017/044382 filed on Dec. 11, 2017, which claims priority benefit of Japanese Patent Application No. JP 2017-008399 filed in the Japan Patent Office on Jan. 20, 2017. Each of the above-referenced applications is hereby incorporated herein by reference in its entirety.

TECHNICAL FIELD

The present disclosure relates to an audio signal reproduction apparatus and a control method.

BACKGROUND ART

In an amplifier driven by a battery (for example, audio amplifier for amplifying audio signal), a remaining capacity of the battery is decreased along with the use of the audio amplifier. Accordingly, in order to prolong a continuous operation time of an audio apparatus to which the audio amplifier is applied, it is desirable to execute a control depending on the remaining capacity of the battery. For example, Patent Literature 1 below describes an audio apparatus that decreases a clip level of clipping a sound pressure level depending on a decrease in a voltage of a battery.

CITATION LIST

Patent Literature

Patent Literature 1: Japanese Patent Application Laid-open No. 2016-54438

DISCLOSURE OF INVENTION

Technical Problem

Incidentally, a battery generally generates heat during the use and a temperature is changed. The audio apparatus described in Patent Literature 1 reproduces the audio signal even if the temperature of the battery deviates a specification range, degradation of the battery may proceed.

Accordingly, it is an object of the present disclosure to provide an audio signal reproduction apparatus and a control method of performing an output control in consideration not only of a voltage of a battery but also of a temperature of a battery.

Solution to Problem

The present disclosure is, for example,
In addition, the present disclosure is.

Advantageous Effects of Invention

According to at least embodiment of the present disclosure, an output control can be performed in consideration of a temperature of a battery. It should be noted that the effects described here are not necessarily limitative and may be any of effects described in the present disclosure. In addition, the contents of the present disclosure should not be construed as limitative by the illustrative effects.

BRIEF DESCRIPTION OF DRAWINGS

FIGS. 9A and 9B are diagrams of describing a fifth control example.

FIGS. 10A and 10B are diagrams of describing a content of the fifth control example.

FIGS. 11A and 11B are diagrams of describing the content of the fifth control example.

MODE(S) FOR CARRYING OUT THE INVENTION

Hereinafter, an embodiment and the like of the present disclosure will be described with reference to the drawings. Note that the description will be made in the following order.
<1. Embodiment>
<2. Modification Embodiment>

Hereinafter, favorable embodiments for carrying out the present disclosure will be described. It should be noted that the present disclosure is not limited to the embodiments.

1. Embodiment

Configuration Example of Audio Signal Reproduction Apparatus

First, a configuration example of an audio signal reproduction apparatus will be described. The audio signal reproduction apparatus according to the present embodiment is a speaker device (referred to as wireless speaker or the like) having a portable size capable of reproducing an audio signal, for example.

Figure 1:
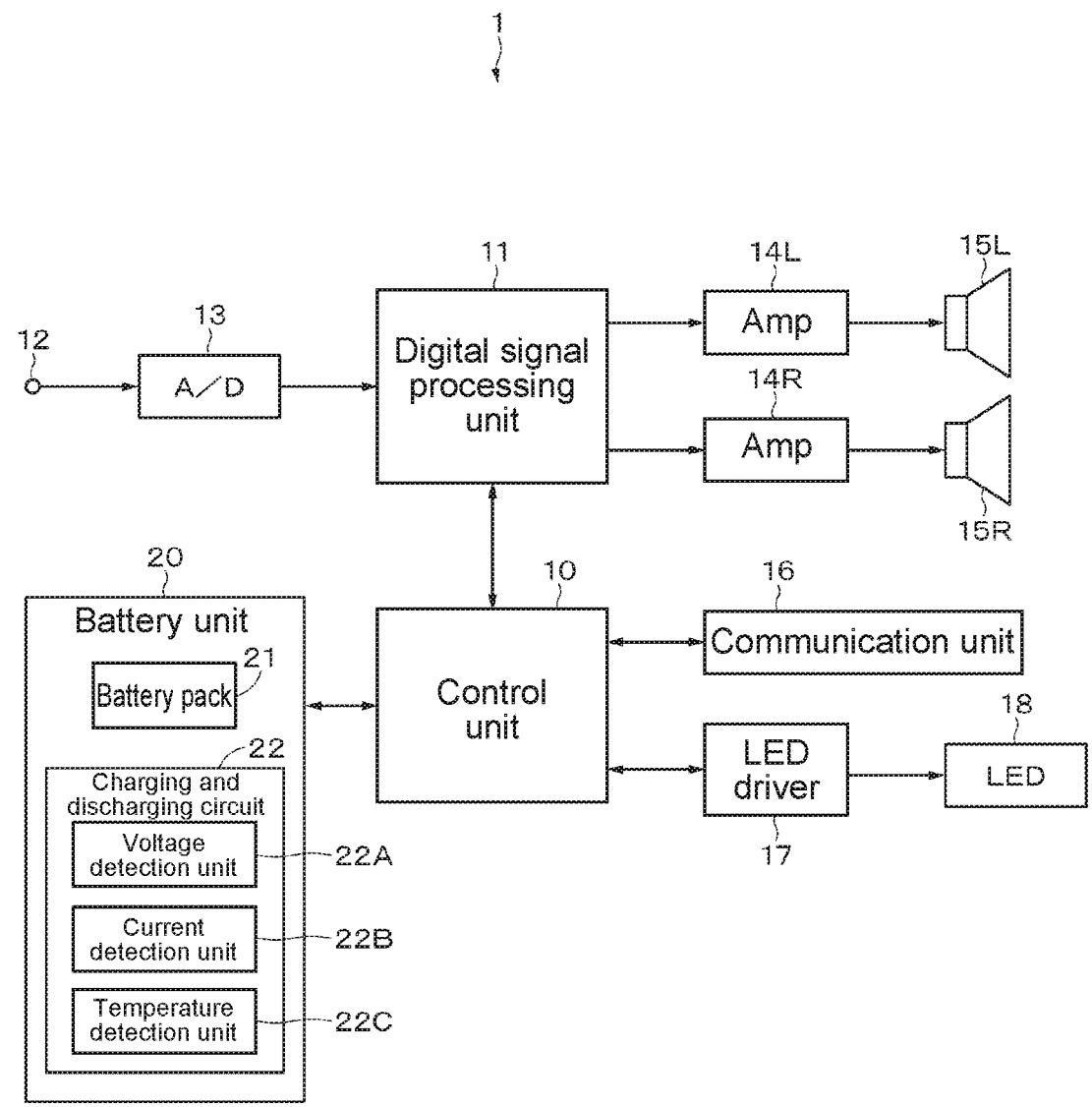
FIG. 1 is a block diagram showing a configuration example of an audio signal reproduction apparatus according to an embodiment.

FIG. 1 is a block diagram showing a configuration example of the audio signal reproduction apparatus (audio signal reproduction apparatus 1) according to the present embodiment. The audio signal reproduction apparatus 1 includes a control unit 10, a digital signal processing unit 11, an input terminal 12, an A/D (Analog to Digital) converter 13, an amplifier 14L, an amplifier 14R, a speaker unit 15L, a speaker unit 15R, a communication unit 16, an LED (Light Emitting Diode) driver 17, an LED 18, and a battery unit 20.

The control unit 10 includes, for example, a CPU (Central Processing Unit) and controls each unit of the audio signal reproduction apparatus 1. The control unit 10 includes a ROM (Read Only Memory) on which a program executed by the control unit 10 is stored, a RAM (Random Access Memory) used as a work area, and the like. The control unit 10 controls an output of the audio signal reproduction apparatus 1 on the basis of temperature information and voltage information fed from the battery unit 20, which will be described later.

The digital signal processing unit 11 includes, for example, a DSP (Digital Signal Processor). The digital signal processing unit 11 has functions such as a function of uniformly adjusting (changing) a sound pressure level of an audio signal (volume adjust function), a function of correcting a frequency characteristic of the audio signal, and a function of compressing (suppressing) the sound pressure level within a limit value in a case where the sound pressure exceeds the limit value (hereinafter appropriately referred to as DRC (Dynamic Range Compression)). The digital signal processing unit 11 executes the above-described functions depending on a control by the control unit 10, as appropriate.

The input terminal 12 is a terminal for connecting by wire the audio signal reproduction apparatus 1 to an external electronic device. Examples of the external electronic device includes reproduction apparatuses such as a smartphone, a television reception apparatus, a CD (Compact Disc), a DVD (Digital Versatile Disc), and a BD (Blu-ray Disc (registered trademark)). An exemplary configuration is that a 2-channel audio signal can be inputted to the audio signal reproduction apparatus 1 via the input terminal 12.

The A/D converter 13 converts an analog audio signal taken via the input terminal 12 into a digital audio signal.

Among audio signals to which signal processing is applied by the digital signal processing unit 11, an audio signal of a L (Left) channel is fed to the amplifier 14L. The amplifier 14L amplifies the fed audio signal with a predetermined amplification factor and feeds the amplified audio signal to the speaker unit 15L. Among the audio signals to which the signal processing is applied by the digital signal processing unit 11, an audio signal of a R (Right) channel is fed to the amplifier 14R. The amplifier 14R amplifies the fed audio signal with a predetermined amplification factor and feeds the amplified audio signal to the speaker unit 15R. The audio signals are reproduced from the speaker units 15L and 15R as output units.

The communication unit 16 wirelessly communicates with the external electronic device corresponding to a predetermined wireless communication standard. Examples of the external electronic device include a personal computer, a smartphone, a mobile-type audio reproduction apparatus, and the like. In addition, examples of the predetermined wireless communication standard include a wireless LAN (Local Area Network), the Bluetooth (registered trademark), the WiFi (registered trademark), infrared communication, and the like. For example, the communication unit 16 receives the 2-channel audio signal from the external electronic device. The communication unit 16 performs demodulation processing, error correction processing, A/D conversion processing, and the like on the audio signal. The audio signal to which the processing is applied is fed to the digital signal processing unit 11 via the control unit 10.

The LED driver 17 is a circuit that controls light emission of the LED 18 depending on the control by the control unit 10. The LED 18 is a diode of red, blue, or the like. The LED driver 17 causes the LED 18 to emit light when the communication unit 16 communicates with the external electronic device. The LED 18 may includes a plurality of LEDs and the number of the plurality of LEDs to emit light may be changed depending on a remaining capacity of the battery pack as described later.

The battery unit 20 includes a battery pack (battery) 21 and a charging and discharging circuit 22 connected to the battery pack 21.

The battery pack 21 is a chargeable secondary battery. In the present embodiment, the battery pack 21 is described as the lithium ion secondary battery. The lithium ion secondary battery according to the present embodiment has a cylinder shape, for example. An average output of one lithium ion secondary battery (single cell) is about 3.7 V (volts). In addition, a normal usage range is, for example, from 2.7 V to 4.2 V. Further, a usage temperature range of the battery pack 21 is, for example, from 0° C. to 60° C. The battery pack 21 has a structure that single cells of two lithium ion secondary batteries are connected in series, for example. It should be appreciated that the number of cells and a cell connection structure of the lithium ion secondary battery configuring the battery pack 21 may be changed, as appropriate.

Power is fed from the battery pack 21 to each unit of the audio signal reproduction apparatus 1. For example, power is fed from battery pack 21 to drive the control unit 10, the digital signal processing unit 11, the amplifiers 14L and 14R, and the like. Note that an output of the battery pack 21 may be converted by a DC (Direct Current)—DC converter, a regulator, or the like, as appropriate, and may be fed to each unit.

Figure 2:
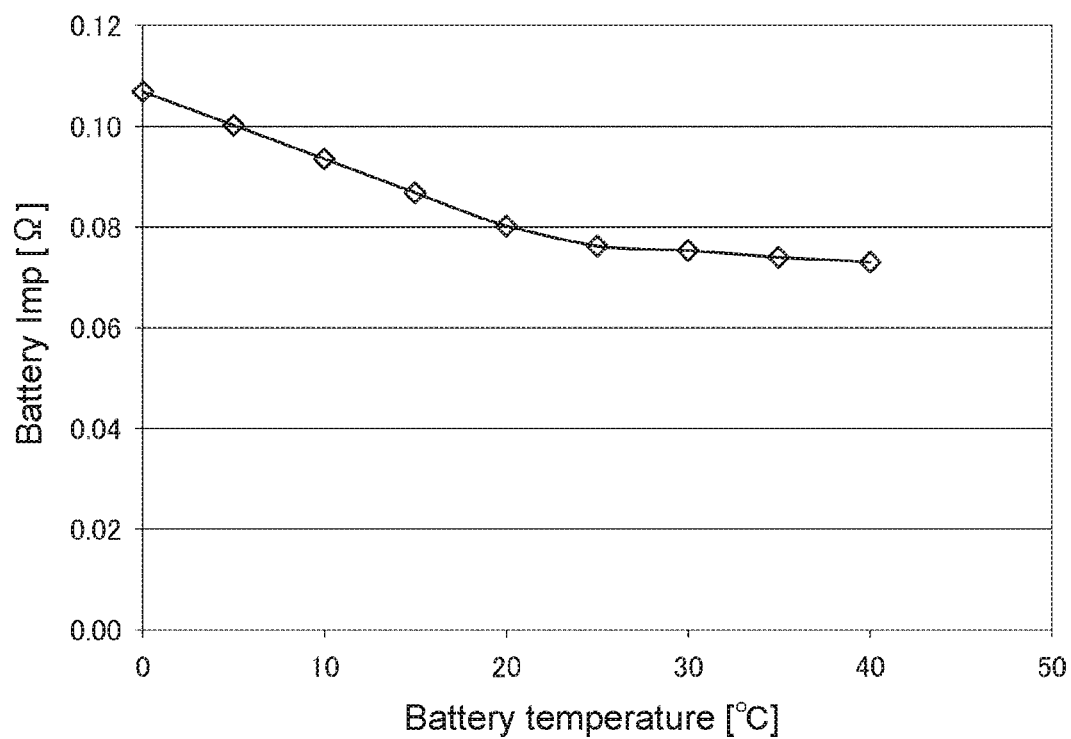
FIG. 2 is a graph showing a characteristic of a battery pack according to the embodiment.

The battery pack 21 include resistance inside (internal impedance of battery pack 21). The internal impedance has a value that is changed depending on the temperature. FIG. 2 is a graph showing a relationship between the temperature and the internal impedance in the battery pack 21 according to the present embodiment. In the graph of FIG. 2, the horizontal axis shows the temperature (° C.) of the lithium ion secondary battery cell and the vertical axis shows the internal impedance ($\Omega$) of the lithium ion secondary battery cell. As shown in FIG. 2, the internal impedance of the lithium ion secondary battery is changed depending on the temperature. The lower the temperature is, the greater the internal impedance is.

Returning to FIG. 1, the description will be continued. The charging and discharging circuit 22 is a circuit of controlling charging and discharging of the battery pack 21. The charging and discharging circuit 22 includes a discharge control switch, a charge control switch, and the like including a switching element such as, for example, an FET (Field effect transistor), and also includes a voltage detection unit 22A, a current detection unit 22B, and a temperature detection unit 22C. The voltage detection unit 22A detects the voltage of the battery pack 21. The current detection unit 22B is, for example, current detection resistance and detects a current flowing through the charging and discharging circuit 22. The temperature detection unit 22C is a temperature detection element such as thermistor and detects the temperature of the battery pack 21. With respect to the voltage, the current, and the temperature detected by each detection unit, the control unit 10 periodically detects the voltage and the like. For example, the control unit 10 detects the voltage and the like for every 100 ms (milliseconds).

The voltage detection unit 22A detects the voltage of the battery pack 21, to thereby providing information showing the voltage (hereinafter appropriately referred to as voltage information). The current detection unit 22B detects the current flowing through the charging and discharging circuit 22, to thereby providing information showing the current (hereinafter appropriately referred to as current information). The temperature detection unit 22C detects the temperature of the battery pack 21, to thereby providing information showing the temperature (hereinafter appropriately referred to as temperature information). The voltage information, the current information, the temperature information, and the like are used for a known protection operation to protect overcharge, overdischarge, overcurrent, abnormal heat generation of the battery pack 21. The protection operation of the battery pack 21 may be performed by the control unit 10 or may be performed by a microcomputer of the battery unit 20. The temperature information and the voltage information are fed from the battery unit 20 to the control unit 10 and used for an output control described later.

Note that although a configuration is not shown, the audio signal reproduction apparatus 1 is configured to be connected to a commercial power supply, a personal computer, or the like so that the battery pack 21 can be charged with power fed therefrom.

Operation Example of Audio Signal Reproduction Apparatus

Next, a normal operation example of the audio signal reproduction apparatus 1 will be described. The audio signal is inputted to the audio signal reproduction apparatus 1 via the input terminal 12 or the communication unit 16. The audio signal is converted into a digital format audio signal by the A/D converter 13 or the communication unit 16. Signal processing is applied to the converted audio signal by the digital signal processing unit 11. The audio signal of an L channel from the audio signals to which the signal processing is applied by the digital signal processing unit 11 is fed to the amplifier 14L. Then, the audio signal amplified with a predetermined amplification factor by the amplifier 14L is reproduced from the speaker unit 15L. The audio signal of an R channel from the audio signals to which the signal processing is applied by the digital signal processing unit 11 is fed to the amplifier 14R. Then, the audio signal amplified with a predetermined amplification factor by the amplifier 14R is reproduced from the speaker unit 15L.

Problems to be Considered in Audio Signal Reproduction Apparatus

Figure 3A:
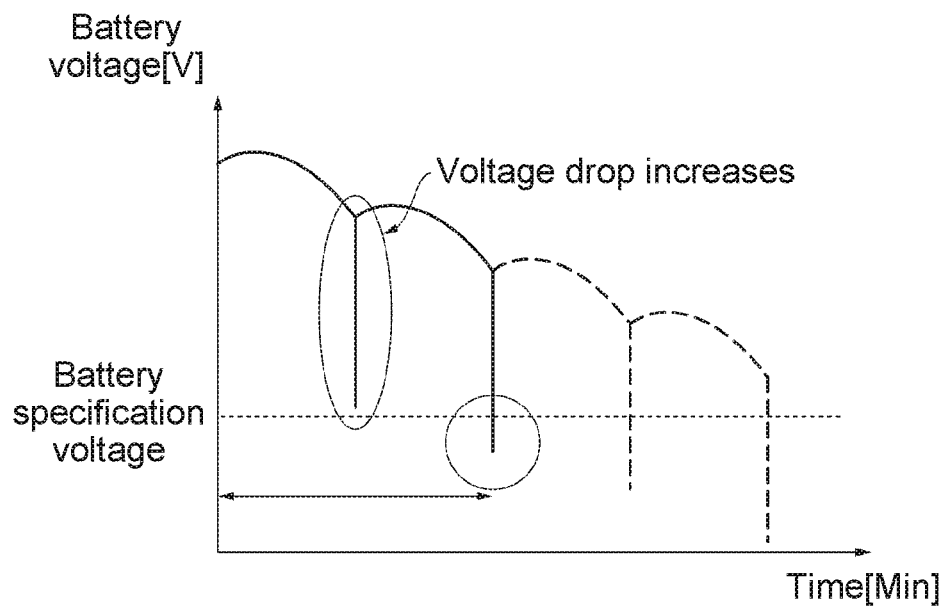
FIG. 3A and FIG. 3B are diagrams for describing problems to be considered in an audio signal reproduction apparatus according to the embodiment.
Figure 3B:
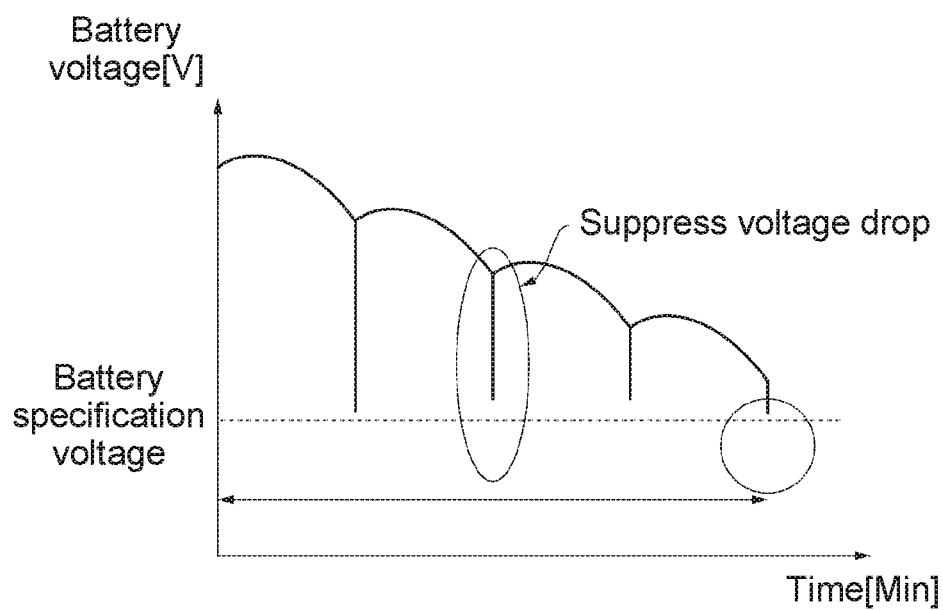
Figure 4A:
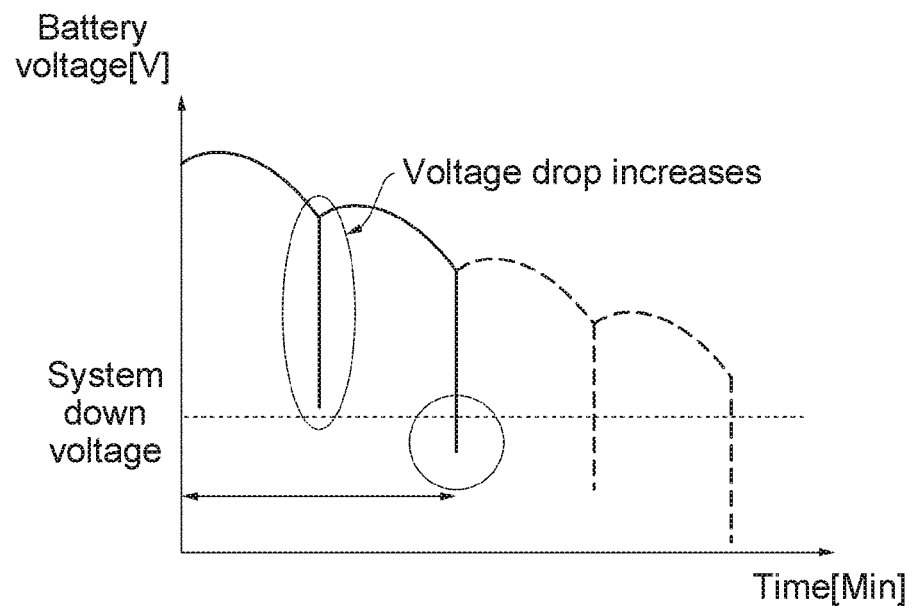
FIG. 4A and FIG. 4B are diagrams for describing problems to be considered in an audio signal reproduction apparatus according to the embodiment.
Figure 4B:
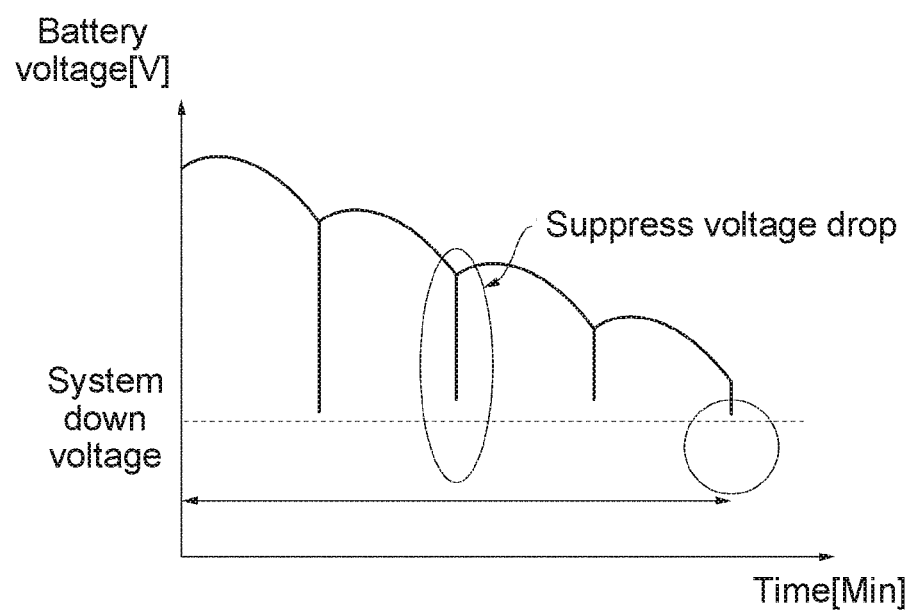

Here, with reference to FIGS. 3A, 3B, 4A, and 4B, problems to be considered in the audio signal reproduction apparatus 1 will be described. In each of FIG. 3A, FIG. 3B, FIG. 4A, and FIG. 4B, the horizontal axis shows a time axis and the vertical axis shows the voltage of the battery pack 21. In addition, a battery specification voltage of FIG. 3A and FIG. 3B is a threshold value that the voltage of the battery pack 21 is not overdischarged. In a case where the battery pack 21 is a single cell, the threshold value is 2.5 V, for example. In addition, a system down voltage of FIG. 4A and FIG. 4B is an operating voltage necessary for operating the control unit 10 and the like and is 3.3 V or 5 V, for example. If the voltage of the battery pack 21 is below the system down voltage, the system of the audio signal reproduction apparatus 1 such as the control unit 10 may goes down.

As described above, since the battery pack 21 has the internal impedance, the voltage of the battery pack 21 is dropped depending on the current taken out from the battery pack 21, i.e., a voltage drop occurs. Here, if the audio signal includes an output area having a large sound pressure level as a source and a sound is outputted at the output area, a load current I flowing to the speaker units 15L and 15R is increased. In this case, the load current I is fed from the battery pack 21 and the voltage drop (V=RI) internal resistance R is thus increased. By the voltage drop, as shown in FIG. 3A and FIG. 4A, the voltage of the battery pack 21 may be below the battery specification voltage or the system down voltage. Therefore, as schematically shown in FIG. 3B and FIG. 4B, it is desirable to suppress the voltage drop by adequately controlling the output of the audio signal reproduction apparatus 1. Hereinafter, specific examples of the output control of the audio signal reproduction apparatus 1 performed from this point of view will be described.

Output Control Example Based on Temperature Information

Figure 5:
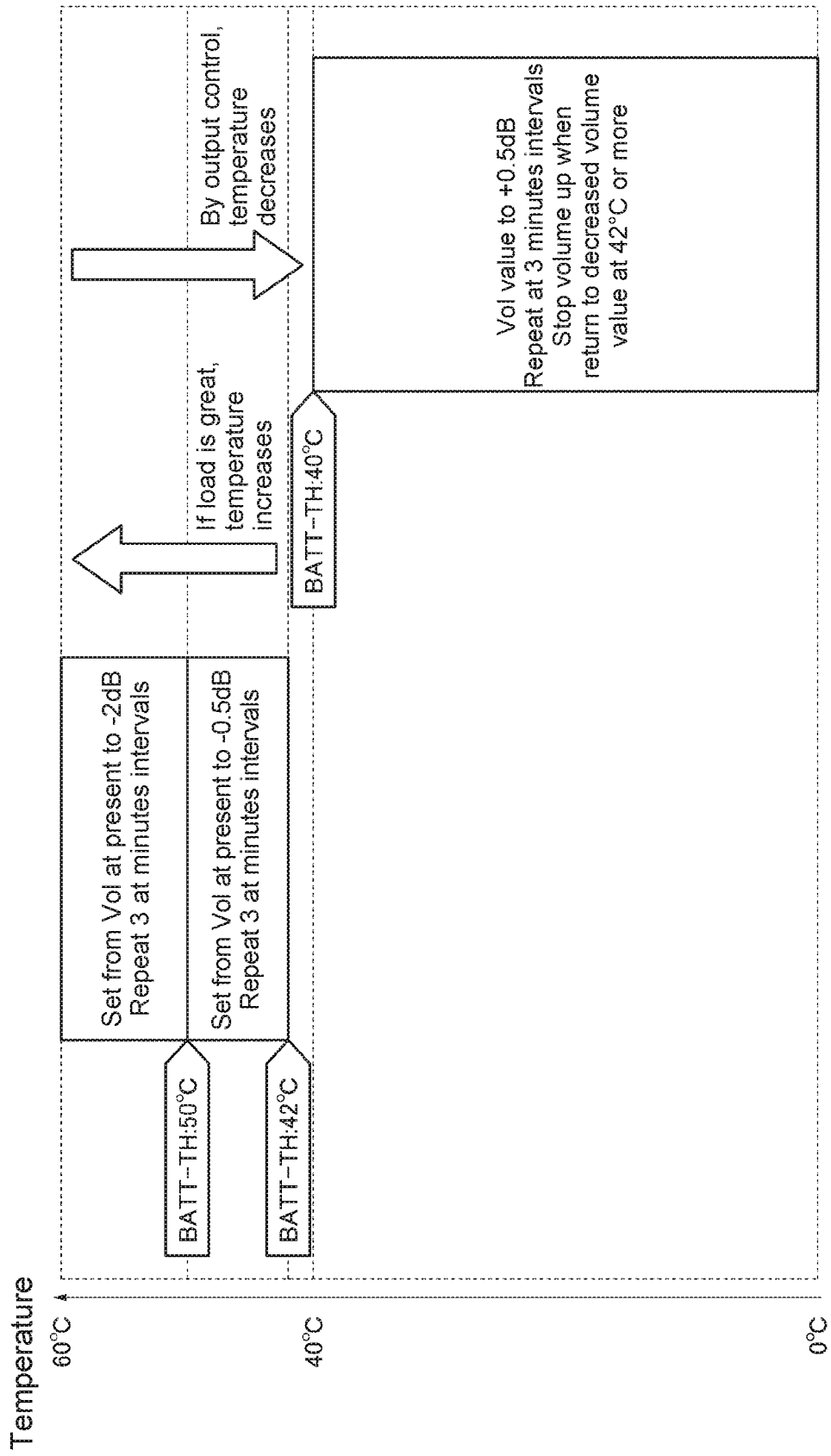
FIG. 5 is a diagram of describing a content of a first control example.

First, a first control example and a second control example will be described as output control examples based on temperature information. The first control example is that a volume value of the audio signal is changed on the basis of the temperature information. FIG. 5 is a diagram of describing the first control example. With reference to FIG. 5, the first control example will be described.

In FIG. 5, a gain against a volume value is not changed within a temperature range of the battery pack 21 from 0° C. to 42° C. For example, as the sound pressure level of the audio signal is increased, the load current to the amplifiers 14L and 14R is increased and the battery pack 21 generates heat. It assumes that the temperature of the battery pack 21 detected by the temperature detection unit 22C exceeds the threshold value (for example, 42° C.). In this case, the control unit 10 instructs the digital signal processing unit 11 to set the gain against the volume value at present to −0.5 dB (decibel). The value of the gain may be any appropriate value and is preferably a value that a volume change is less aurally recognizable to a listener. The control is repeated at 3 minutes intervals, for example. For example, the gain is set to −1.0 dB 3 minutes later. Thus, the volume value is gradually decreased. Note that a restricted value is set to −6 dB. The digital signal processing unit 11 changes the volume of the audio signal on the basis of the set gain.

It assumes that the temperature of the battery pack 21 is yet increased by the above-described control, e.g., that the temperature of the battery pack 21 detected by the temperature detection unit 22C exceeds the other threshold value (for example, 50° C.). In this case, the control unit 10 instructs the digital signal processing unit 11 to set the gain against the volume value at the time point to −2 dB. In the case of the gain against the volume value is −2 dB, the value is set to have a priority to decrease the temperature of the battery pack 21, although the volume change is easily aurally recognizable to the listener. The control is repeated at 3 minutes intervals, for example. For example, the gain is set to −4.0 dB 3 minutes later. The restricted value is not set to have a priority to decrease the temperature of the battery pack 21. Note that as the load current is decreased by the above-described control, the temperature of the battery pack 21 is generally decreased. However, if the temperature of the battery pack 21 exceptionally reaches 60° C., the operation of the audio signal reproduction apparatus 1 is controlled to be stopped.

It assumed that the temperature of the battery pack 21 is decreased depending on the above-described control. For example, it assumes that the temperature of the battery pack 21 detected by the temperature detection unit 22C is the threshold value (for example, 40° C.) or less. The threshold value used to decide whether or not the temperature of the battery pack 21 is decreased is allowed to have hysteresis with respect to the threshold value (above-described 42° C.) used to decide whether or not the temperature of the battery pack 21 is increased. Thus, the volume value can be prevented from being frequently changed.

In a case where the temperature of the battery pack 21 detected by the temperature detection unit 22C becomes 40° C. or less, the control unit 10 instructs the digital signal processing unit 11 to set the gain against the volume value at the time point to +0.5 dB. The control is repeated at 3 minutes intervals, for example, and the volume value is gradually increased. At the time point that the volume value is returned to the volume value at the time point of 42° C. or more as described above (initial volume value), the control is stopped. Note that in a case where the temperature of the battery pack 21 exceeds 42° C. during the control of increasing the volume value, the control is performed to decrease the above-described volume value.

Figure 6:
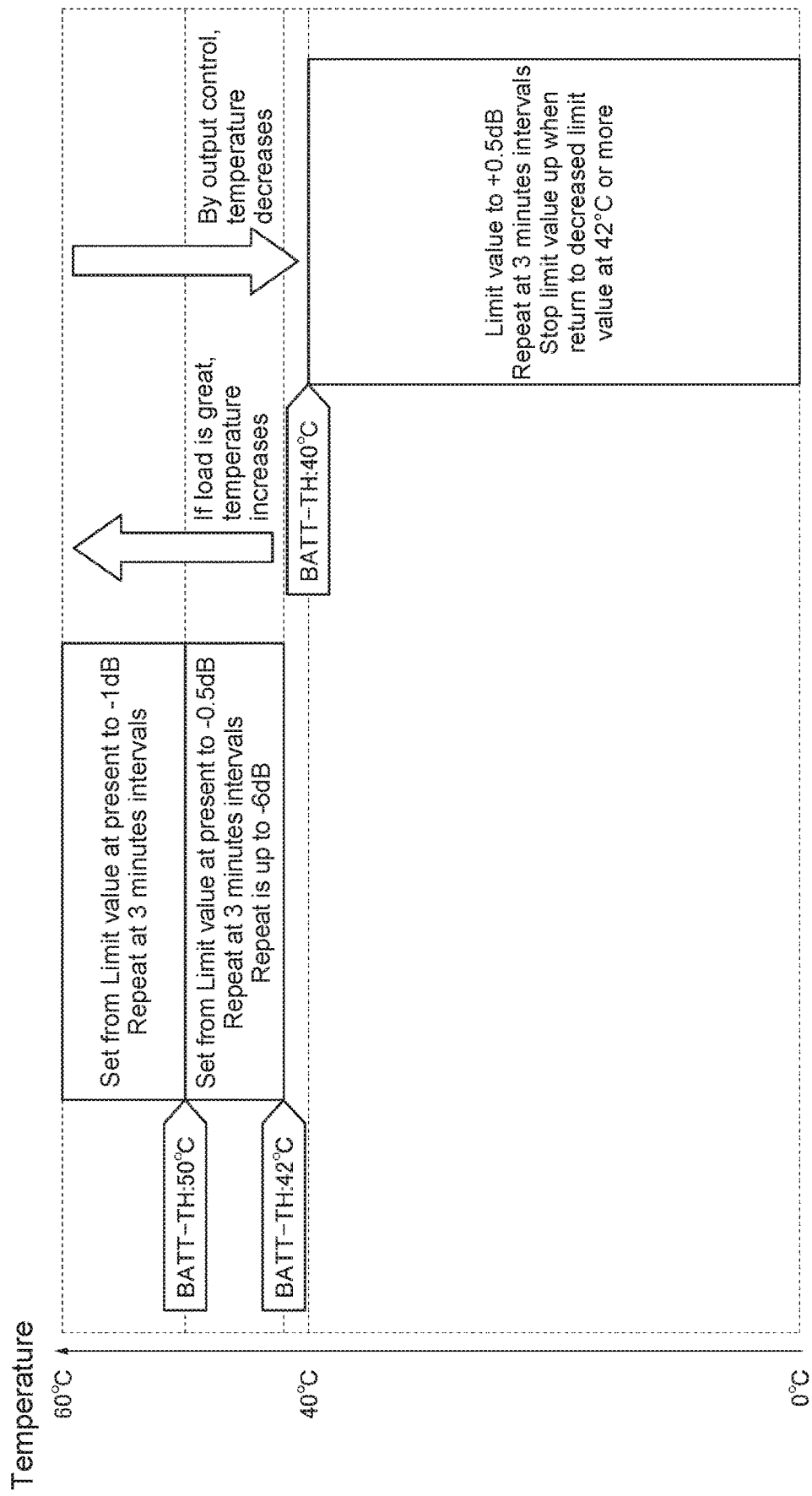
FIG. 6 is a diagram of describing a content of a second control example.

The second control example is that the limit value in the DRC is changed on the basis of the temperature information. FIG. 6 is a diagram of describing the second control example.

In FIG. 6, in the range of the temperature of the battery pack 21 from 0° C. to 42° C., the limit value is not changed, in other words, a state is equivalent to a state to which no DRC is applied, and a full-scale audio signal is reproduced. For example, as the sound pressure level of the audio signal is increased, the load current to the amplifiers 14L and 14R is increased, and the battery pack 21 generates heat. Then, it assumes that the temperature of the battery pack 21 detected by the temperature detection unit 22C exceeds the threshold value (for example, 42° C.). In this case, the control unit 10 instructs the digital signal processing unit 11 to set the limit value in the DRC from the limit value at present to −0.5 dB. The set limit value may be any appropriate value and is preferably a value that a compression effect by the DRC is less aurally recognizable to a listener. The control is repeated at 3 minutes intervals, for example. For example, the limit value is set to −1.0 dB 3 minutes later. Thus, the effect by the DRC is gradually increased. Note that −6 dB is the restricted value.

It assumes that the temperature of the battery pack 21 is yet increased by the above-described control, e.g., that the temperature of the battery pack 21 detected by the temperature detection unit 22C exceeds the threshold (for example, 50° C.). In this case, the control unit 10 instructs the digital signal processing unit 11 to set the limit value of −1 dB from the limit value at the time point. In the case, the value is set to have a priority to decrease the temperature of the battery pack 21, although the compression effect by the DRC is easily recognizable to the listener. The control is repeated at 3 minutes intervals, for example, to thereby changing the limit value and increasing the compression effect by the DRC. Note that the restricted value is not set to have a priority to decrease the temperature of the battery pack 21. As the load current is decreased by the above-described control, the temperature of the battery pack 21 is generally decreased. However, if the temperature of the battery pack 21 reaches 60° C., the operation of the audio signal reproduction apparatus 1 is controlled to be stopped.

It assumes that the temperature of the battery pack 21 is decreased depending on the above-described control. For example, it assumes that the temperature of the battery pack 21 detected by the temperature detection unit 22C is the threshold value (for example, 40° C.) or less. Similar to the first control example, the threshold value used to decide whether or not the temperature of the battery pack 21 is decreased is allowed to have hysteresis with respect to the threshold value (above-described 42° C.) used to decide whether or not the temperature of the battery pack 21 is increased. Thus, the limit value in the DRC can be prevented from being frequently changed.

In a case where the temperature of the battery pack 21 detected by the temperature detection unit 22C becomes 40° C. or less, the control unit 10 instructs the digital signal processing unit 11 to set the limit value from the limit value at present to +0.5 dB. The control is repeated at 3 minutes intervals, for example, and the volume value is gradually increased. At the time point that the limit value is returned to the limit value at the time point of 42° C. or more as described above, the control is stopped. Note that in a case where the temperature of the battery pack 21 exceeds 42° C. during the control of increasing the limit value, the control is performed to increase the above-described effect by the DRC.

As described above, by performing the output control on the basis of the temperature information, the temperature of the battery pack 21 can be prevented from exceeding the usage temperature range.

Output Control Example Based on Voltage Information

Next, a third control example and a fourth control example will be described as output control examples based on voltage information. Note that in the third and fourth control examples, it will be described such that the battery pack 21 has a structure that two lithium ion secondary batteries are connected in series.

The third control example is an example that a maximum value of the volume value of the audio signal (hereinafter appropriately referred to as maximum volume value) is changed on the basis of the voltage information. Note that it is described such that setting of the volume value can be changed by 0 to 50 steps.

Figure 7:
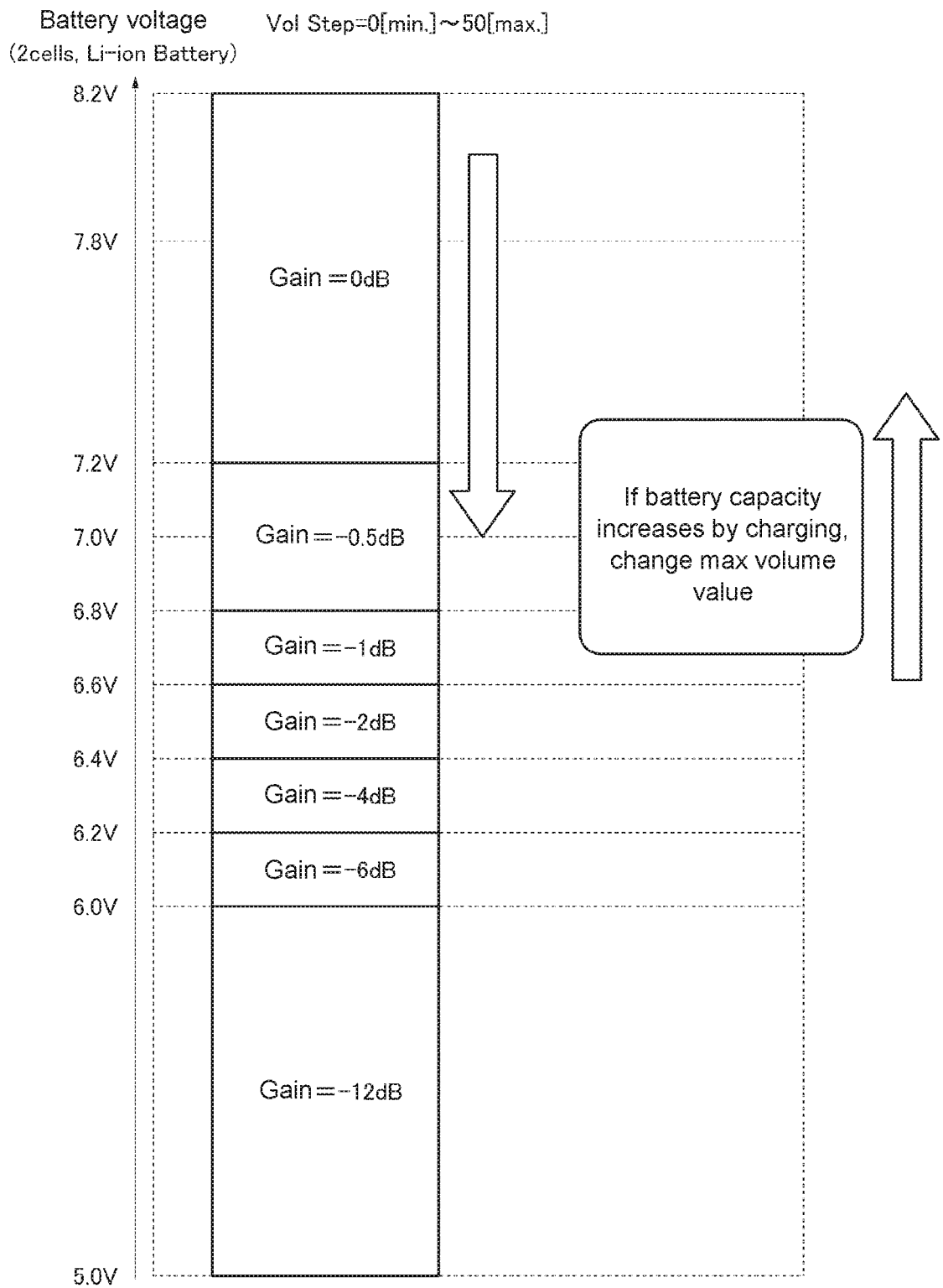
FIG. 7 is a diagram of describing a content of a third control example.

FIG. 7 is a diagram of describing the third control example. With reference to FIG. 7, the third control example will be described. As shown in FIG. 7, in a case where the remaining capacity of the battery pack 21 is within the range of 7.2V to 8.2V, the gain=0 dB and the maximum volume value is not changed. In a case where the remaining capacity of the battery pack 21 is within the range of 6.8V to less than 7.2V, the maximum volume value is set to −0.5 dB. In a case where the remaining capacity of the battery pack 21 is within the range of 6.6V to less than 6.8V, the maximum volume value is set to −1.0 dB. In a case where the remaining capacity of the battery pack 21 is within the range of 6.4V to less than 6.6V, the maximum volume value is set to −2.0 dB. In a case where the remaining capacity of the battery pack 21 is within the range of 6.2V to less than 6.4V, the maximum volume value is set to −4.0 dB. In a case where the remaining capacity of the battery pack 21 is within the range of 6.0V to less than 6.2V, the maximum volume value is set to −6.0 dB. In a case where the remaining capacity of the battery pack 21 is within the range of 5.0V to less than 6.0V, the maximum volume value is set to −12 dB.

Since the maximum volume value is further restricted depending on a decrease in the remaining capacity of the battery pack 21 by the control, the load current flowing through the amplifiers 14L and 14R can be decreased and the voltage drop can be decreased even if the sound pressure level of the audio signal is high. Accordingly, the voltage of the battery pack 21 can be prevented from being below the specification voltage and the system down voltage.

In a case where the audio signal reproduction apparatus 1 is charged and the voltage of the battery pack 21 is increased (recovered), the control is performed such that the gain is reset depending on the voltage and the restriction of the maximum volume value is relaxed. Note that since the maximum volume value is restricted in the control, a UI (User Interface) relating to the volume may be changed. For example, in a case where the maximum volume value is 50 dB and the gain set by the above-described control is −12 dB, the UI may be changed to display 38 dB.

Figure 8:
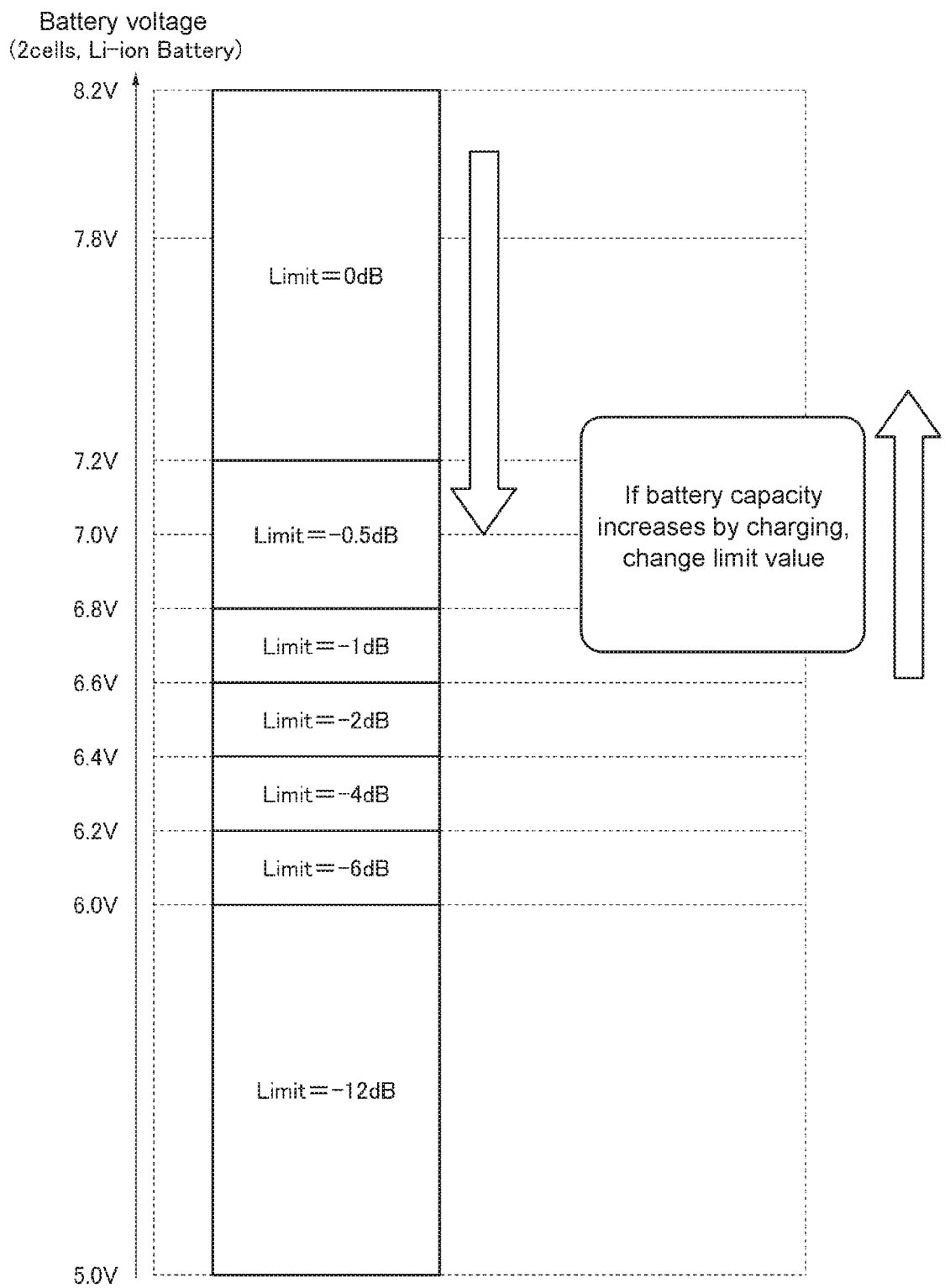
FIG. 8 is a diagram of describing a content of a fourth control example.

The fourth control example is an example that the limit value in the DRC is changed on the basis of the voltage information. FIG. 8 is a diagram of describing the fourth control example. With reference to FIG. 8, the fourth control example will be described.

In a case where the voltage of the battery pack 21 is within the range of 7.2V to 8.2V, the limit value is not changed, in other words, a full-scale audio signal is reproduced as it is. In a case where the remaining capacity of the battery pack 21 is within the range of 6.8V to less than 7.2V, the limit value is set to −0.5 dB. In a case where the remaining capacity of the battery pack 21 is within the range of 6.6V to less than 6.8V, the limit value is set to −1.0 dB. In a case where the remaining capacity of the battery pack 21 is within the range of 6.4V to less than 6.6V, the limit value is set to −2.0 dB. In a case where the remaining capacity of the battery pack 21 is within the range of 6.2V to less than 6.4V, the limit value is set to −4.0 dB. In a case where the remaining capacity of the battery pack 21 is within the range of 6.0V to less than 6.2V, the limit value is set to −6.0 dB. In a case where the remaining capacity of the battery pack 21 is within the range of 5.0V to less than 6.0V, the limit value is set to −12 dB.

By the control, the compression effect of the audio signal by the DRC is increased depending on the decrease in the remaining capacity of the battery pack 21. If the sound pressure level of the audio signal is high, the sound pressure level can be compressed. Accordingly, the load current flowing through the amplifiers 14L and 14R can be decreased and the voltage drop can be decreased. Thus, the voltage of the battery pack 21 can be prevented from being below the specification voltage and the system down voltage caused by the voltage drop.

In a case where the audio signal reproduction apparatus 1 is charged and the voltage of the battery pack 21 is increased (recovered), the control is performed such that the limit value is reset depending on the voltage, and the compression effect by the DRC is relaxed.

Output Control Example Based on Temperature Information and Voltage Information

Next, an output control example (fifth control example) based on the temperature information and the voltage information will be described with reference to FIGS. 9A, 9B, 10A, 10B, 11A, and 11B. In the fifth control example, the output control will be described taking the control of the audio signal by the DRC as an example. As in the first control example, the volume of the audio signal may be controlled.

The control unit 10 has a first table in which the control information for performing the output control is associated with the temperature. In addition, the control unit 10 has a second table in which the control information for performing the output control is associated with the voltage.

FIG. 9A shows a table TA1 as an example of the first table. As shown in FIG. 9A, the table TA1 describes the temperature of the battery pack 21 being associated with the limit value in the DRC as an example of the control information. The temperature is divided in appropriate zones and a state number (State) is added corresponding to each zone.

FIG. 9B shows a table TA2 as an example of the second table. As shown in FIG. 9B, the table TA2 describes the voltage of the battery pack 21 being associated with the limit value in the DRC. The voltage is divided in appropriate zones and a state number (State) is added corresponding to each zone. The tables TA1 and TA2 are stored in the RAM included in the control unit 10, for example.

The control unit 10 refers to the table TA1 and the table TA2 and performs the output control. For example, it assumes that the control unit 10 receives the temperature information of the battery pack 21 of 20° C. and the voltage information of the battery pack 21 of 6.0V from the battery unit 20. The control unit 10 refers to the table TA1 and acquires the control information corresponding to the temperature information of 20° C. In the present example, as the control information, 0 dB is acquired. In addition, the control unit 10 refers to the table TA2 and acquires the control information corresponding to the voltage information of 6.0V. In this example, as the control information, −4.0 dB is acquired.

The control unit 10 compares the acquired two items of the control information and selects the one with severe conditions, in other words, the one that increases the effect of the DRC. In this example, since two items of the control information are respectively 0 dB and −4.0 dB, −4.0 dB is selected. The control unit 10 sets the selected control information on the digital signal processing unit 11. The digital signal processing unit 11 performs processing on the audio signal on the basis of the control information selected by the control unit 10. Note that in a case where the values of the control information are the same, any of which may be selected.

As described above, since the control is performed based on the control information having a greater effect, the temperature of the battery pack 21 can be prevented from exceeding the usage temperature range, and the voltage of the battery pack 21 can be prevented from being below the specification voltage and the system down voltage.

Note that as described with reference to FIG. 2, the lower the temperature of the battery pack 21 is, the greater the internal impedance of the battery pack 21 is. The greater the internal impedance is, the greater the voltage drop is. Accordingly, in a case where the temperature of the battery pack 21 is low, the control is preferably performed not depending on the temperature of the battery pack 21 but depending on the remaining capacity of the battery pack 21. On the other hand, in a case where the temperature of the battery pack 21 is high, the internal impedance of the battery pack 21 is decreased. The smaller the internal impedance is, the smaller the voltage drop is. Accordingly, in a case where the temperature of the battery pack 21 is high, the control is preferably performed not depending on the remaining capacity of the battery pack 21 but depending on the temperature of the battery pack 21. In view of the above-described points, according to the present embodiment, a plurality of second tables is prepared and the tables to which the control unit 10 refers are switched depending on the temperature information of the battery pack 21.

FIG. 10A shows the above-described table TA1. FIG. 10B shows a table TA2a used when the temperature information of the battery pack 21 shows 0° C. In the table TA2a, the control information is described so that in a case where the remaining capacity of the battery pack 21 is low, the control effect by the DRC is great. For example, as to the control information corresponding to the state number 6 (voltage (Vbat) of battery pack 21 is in a range of 6.0≤Vbat<6.2), −4.0 dB is described in the table TA2 and −6.0 dB is described in the table TA2a. Depending on the control with reference to the table TA2, in a case where the temperature of the battery pack 21 is low, the voltage drop is increased, which may result in the voltage of the battery pack 21 below the battery specification voltage or the system down voltage. However, in a case where the temperature of the battery pack 21 is low, the control unit 10 refers to the table TA2, which may preferentially realize the control depending on the remaining capacity of the battery pack 21 and realize the control by which the effect by the DRC is increased. Thus, even if the voltage drop is increased, the voltage of the battery pack 21 can be prevented from being below the specification voltage and the system down voltage.

FIG. 11A shows the above-described table TA1. FIG. 11B shows the table TA2b used if the temperature information of the battery pack 21 shows 55° C. In the table TA2b, the control information is described so that even if the remaining capacity of the battery pack 21 is low, the control effect by the DRC becomes not so great. For example, as to the control information corresponding to the state number 6 (voltage (Vbat) of battery pack 21 is in a range of 6.0≤Vbat<6.2), −4.0 dB is described in the table TA2 and −3.0 dB is described in the table TA2b.

For example, it assumes that the control unit 10 receives the temperature information of the battery pack 21 of 55° C. and the voltage information of the battery pack 21 of 6.0V from the battery unit 20. The control unit 10 refers to the table TA1 and acquires the control information corresponding to the temperature information of 55° C. In the present example, as the control information, −4.5 dB is acquired. In addition, the control unit 10 refers to the table TA2b and acquires the control information corresponding to the voltage information of 6.0V. In this example, as the control information, −3.0 dB is acquired.

The control unit 10 compares the acquired two items of the control information and selects the one with severe conditions, in other words, the one that increases the effect of the DRC. In this example, since two items of the control information are respectively −4.5 dB and −3.0 dB, −4.5 dB is selected. The control unit 10 sets the selected control information on the digital signal processing unit 11. The digital signal processing unit 11 performs processing on the audio signal on the basis of the control information selected by the control unit 10.

As described above, in a case where the temperature of the battery pack 21 is high, the internal impedance of the battery pack 21 is decreased and the voltage drop is decreased. On the other hand, since the temperature of the battery pack 21 is high, the control depending on the temperature information is preferably performed. In a case where the temperature of the battery pack 21 is high, the control unit 10 refers to the table TA2b, which may preferentially realize the control depending on the temperature of the battery pack 21 and the temperature of the battery pack 21 can be prevented from exceeding the usage temperature range.

In the above-described fifth control example, as an example of the second table, three tables (table TA2, TA2a, and TA2b) are illustrated and described, but are not limited thereto. An appropriate number of tables can be prepared corresponding to each temperature range and can be applied to the above-described control.

The audio signal reproduction apparatus 1 according to the present embodiment performs the control corresponding to at least the fifth control example. If the remaining capacity is above a certain level, the control depending on the temperature information (e.g., first or second control example) may be performed for simplifying the operation.

One embodiment of the present disclosure is described as above. According to the embodiment, the following effects are provided. In a case where a maximum output that can be outputted from the battery pack 21 is continued under initial conditions (temperature and remaining capacity of battery pack), it reaches an upper limit of the usage temperature range of the battery pack 21, which leads to an damage and a progress of degradation of the battery pack 21. However, by performing the control according to the embodiment, since the output of the output unit is decreased and the output is controlled such that the temperature of the battery pack 21 does exceed the usage temperature range, the battery pack 21 can be safely used.

In addition to a gradual decrease in the voltage as the battery pack 21 is continuously used, an instantaneous voltage drop is generated depending on an increase in an output load. The voltage drop causes an overdischarge state of the battery pack 21, an operation stop of the audio signal reproduction apparatus 1 through the action of a protection circuit, and an damage and a progress of degradation of the battery pack 21. However, by performing the control according to the embodiment, since the output of the output unit is decreased and the output is controlled such that the voltage of the battery pack 21 is not below the battery specification voltage by the voltage drop, the battery pack 21 can be safely used. In addition, by performing the control according to the embodiment, since the output of the output unit is decreased and the output is controlled such that the voltage drop is not below the system down voltage of maintaining the operation of the system, it will be possible to drive the system of the audio signal reproduction apparatus 1 for a longer time.

2. Modification Embodiment

While the specific embodiment of the present disclosure is described as above, the contents of the present disclosure is not limited to the above-described embodiment, and various modification embodiments are possible on the basis of the technical idea of the present disclosure.

In the audio signal reproduction apparatus of the above-described embodiment, any configurations (not shown) may be added. For example, an input unit or a display unit for receiving operations may be arranged. The audio signal reproduction apparatus may be remote-controlled by a remote control apparatus. The audio signal reproduction apparatus may include an insertion into which a mobile memory such as a USB (Universal Serial Bus) memory is inserted. The output unit is not limited to the audio amplifier and may be an amplifier for driving a motor.

The battery pack is not limited to the lithium ion secondary battery and may be other batteries such as a nickel hydrogen battery. In addition, the voltage information of the battery pack is not limited to the voltage as long as the remaining capacity of the battery pack is shown and may be a SOC (State Of Charge) showing a charge degree, for example. Similarly, the control information may be associated not with the voltage but with the SOC in the table TA or the like.

Functions of the control unit and the digital signal processing unit may be configured by one chip IC (Integrated Circuit). In this case, the IC may be the configuration corresponding to the control unit in claims.

The DRC may be a function referred to as multiband DRC that controls the limit value by dividing frequency bands. In the control of the embodiment, only the limit value to the signal corresponding to a specific frequency (e.g., signal corresponding to frequency that becomes great load on battery pack) may be controlled.

The configurations, the methods, the steps, the shapes, the materials, the numerical values, and the like in the above-described embodiments are merely illustrative, and different configurations, methods, steps, shapes, materials, numerical values, and the like may use used as necessary. The above-described embodiment and modification embodiments may be combined, as appropriate.

The present disclosure may also have the following structures.

(1)

An audio signal reproduction apparatus, including:
a temperature detection unit detecting a temperature of a battery pack;
a voltage detection unit detecting a voltage of the battery pack; and
a control unit performing an output control on a basis of temperature information detected by the temperature detection unit and voltage information detected by the voltage detection unit.

(2)

The audio signal reproduction apparatus according to (1), in which
the control unit refers to a first table in which a temperature of the battery pack is associated with control information for performing the output control and a second table in which a voltage of the battery pack is associated with control information for performing the output control and performs the output control.

(3)

The audio signal reproduction apparatus according to (2), in which
the control unit
refers to the first table and acquires first control information corresponding to the temperature information detected by the temperature detection unit,
refers to the second table and acquires second control information corresponding to the voltage information detected by the voltage detection unit, and
selects control information providing a large control effect from the first control information and the second control information and performs the output control on a basis of the selected control information.

(4)

The audio signal reproduction apparatus according to (2) or (3), in which
a plurality of the second tables is set corresponding to the temperature of the battery pack, and
the control unit refers to the second table corresponding to the temperature information detected by the temperature detection unit from the plurality of the second tables.

(5)

The audio signal reproduction apparatus according to any of (1) to (4), in which
the control unit changes a level of an audio signal as the output control.

(6) The audio signal reproduction apparatus according any of (1) to (4), in which
the control unit compresses the level of the audio signal within a threshold value as the output control in a case where the level of the audio signal exceeds the threshold value.

(7) The audio signal reproduction apparatus according to any of (1) to (6), including:
the battery pack.

(8) The audio signal reproduction apparatus according to (7), in which
the battery pack has a characteristic that internal impedance is changed in accordance with a change of the temperature.

(9) The audio signal reproduction apparatus according to (8), in which
the battery pack includes a lithium ion secondary battery.

(10) The audio signal reproduction apparatus according to any of (1) to (9), including:
a communication unit communicating with another device.

(11) A control method by an audio signal reproduction apparatus, including:
detecting a temperature of a battery pack by a temperature detection unit;
detecting a voltage of the battery pack by a voltage detection unit; and
performing an output control by a control unit on a basis of temperature information detected by the temperature detection unit and voltage information detected by the voltage detection unit.

(12) The control method according to (11), in which the control unit
refers to a first table in which a temperature of the battery pack is associated with control information for performing the output control and a second table in which a voltage of the battery pack is associated with control information for performing the output control and performs the output control, and
refers to the second table corresponding to the temperature information detected by the temperature detection unit from a plurality of the second tables set corresponding to the temperature of the battery pack.

(13) The control method according to (11), in which
the control unit changes a level of an audio signal as the output control.

(14) The control method according to (11), in which
the control unit compresses the level of the audio signal within a threshold value as the output control in a case where the level of the audio signal exceeds the threshold value.

REFERENCE SIGNS LIST 1 audio signal reproduction apparatus
10 control unit
11 digital signal processing unit
16 communication unit
21 battery pack
22A voltage detection unit
22C temperature detection unit

The invention claimed is:
1. An audio signal reproduction apparatus, comprising:
circuitry configured to:
set a first table corresponding to temperature information of a battery pack;
set a plurality of tables corresponding to voltage information of the battery pack, wherein the plurality of tables is different from the first table;
detect a temperature of the battery pack;
detect a voltage of the battery pack;
select, from the plurality of tables, a second table corresponding to the temperature information of the temperature of the battery pack;

acquire, from the first table, first control information corresponding to the temperature information of the temperature of the battery pack;

acquire, from the second table, second control information corresponding to the voltage information of the voltage of the battery pack; and execute an output control process based on each of the first control information and the second control information.

2. The audio signal reproduction apparatus according to claim 1, wherein the circuitry is further configured to:

compare the first control information with the second control information; and select one of the first control information or the second control information based on the comparison.

3. The audio signal reproduction apparatus according to claim 1, wherein the circuitry is further configured to change a level of an audio signal based on the execution of the output control process.

4. The audio signal reproduction apparatus according to claim 1, wherein the circuitry is further configured to compress a level of an audio signal to a threshold value based on:

the execution of the output control process, and the level of the audio signal that exceeds the threshold value.

5. The audio signal reproduction apparatus according to claim 1, further comprising the battery pack.

6. The audio signal reproduction apparatus according to claim 5, wherein the battery pack includes an internal impedance, and the internal impedance changes based on a change of the temperature of the battery pack.

7. The audio signal reproduction apparatus according to claim 6, wherein the battery pack includes a lithium ion secondary battery.

8. The audio signal reproduction apparatus according to claim 1, wherein the circuitry is further configured to communicate with an external device.

9. A control method, comprising:

setting a first table corresponding to temperature information of a battery pack;

setting a plurality of tables corresponding to voltage information of the battery pack, wherein the plurality of tables is different from the first table;

detecting a temperature of the battery pack;

detecting a voltage of the battery pack;

selecting, from the plurality of tables, a second table corresponding to the temperature information of the temperature of the battery pack;

acquiring, from the first table, first control information corresponding to the temperature information of the temperature of the battery pack;

acquiring, from the second table, second control information corresponding to the voltage information of the voltage of the battery pack; and executing an output control process based on each of the first control information and the second control information.

10. The control method according to claim 9, further comprising changing a level of an audio signal based on the execution of the output control process.

11. The control method according to claim 9, further comprising compressing a level of an audio signal to a threshold value based on:

the execution of the output control process, and the level of the audio signal that exceeds the threshold value.

* * * * *